United States Patent [19]
Johnson

[11] Patent Number: 5,210,444
[45] Date of Patent: May 11, 1993

[54] DUTY CYCLE METER

[75] Inventor: Jeffrey W. Johnson, Canal Fulton, Ohio

[73] Assignee: The B. F. Goodrich Company, Akron, Ohio

[21] Appl. No.: 811,555

[22] Filed: Dec. 20, 1991

[51] Int. Cl.$^5$ .................. H03K 3/017; H03K 17/56; H03K 5/04
[52] U.S. Cl. .................. 307/265; 307/234; 328/129.1; 377/20
[58] Field of Search .......... 307/234, 265, 353, 234, 307/260; 377/20; 328/58, 129.1, 108, 109, 112; 330/4.3

[56] References Cited

U.S. PATENT DOCUMENTS

| | | | |
|---|---|---|---|
| 3,652,943 | 3/1972 | Piccirilli et al. | 307/234 |
| 3,852,677 | 12/1974 | Neuville | 307/234 |
| 3,980,960 | 9/1976 | Hutchinson | 307/234 |
| 4,475,086 | 10/1984 | Allen | 307/265 |
| 4,870,665 | 9/1989 | Vaughn | 328/58 |
| 4,890,270 | 12/1989 | Griffith | 377/20 |
| 4,912,734 | 3/1990 | Frauenglass | 377/20 |
| 4,959,807 | 9/1990 | Thomspon et al. | 377/20 |
| 5,095,232 | 3/1992 | Hirano et al. | 328/129.1 |

Primary Examiner—William L. Sikes
Assistant Examiner—Toan Tran
Attorney, Agent, or Firm—Nestor W. Shust

[57] ABSTRACT

A circuit for determining the duty cycle of a control signal includes an oscillator that operates at a frequency that is a predetermined multiple of ten higher than the frequency of the control signal. The oscillator output is connected to the count input of a digital counter, and the control signal is connected to a count inhibit input of the counter. Thus, the counter only counts the oscillator output pulses during the active interval of each cycle of the control signal. Timer means are provided to generate a store trigger signal at the end of a predetermined number of control signal cycles. The store command causes the counter to store and visually display the total count of oscillator pulses detected during the active interval of each cycle. Thus, the count total corresponds to the duty cycle of the control signal. A reset timer is provided to initialize the counter after a predetermined delay from the time that the count total was stored. A threshold timer is provided so that the operator can adjust the circuit to only detect control signal cycles that have a predetermined minimum duty cycle. A timer is also provided to stabilize the counter display over a predetermined time period.

20 Claims, 4 Drawing Sheets

DUTY CYCLE METER

BACKGROUND OF THE INVENTION

The invention generally relates to digital electronic control circuits and methods for detecting one or more characteristics of an electrical signal. More specifically, the invention relates to a circuit and method for determining the duty cycle of a digital control signal.

There are many circuits and systems that utilize a digital control signal in which the duty cycle of the signal is an important parameter. For example, in a selective laser sintering machine, a laser beam is used as a localized heat source that can be precisely focused on an area of powdered material. The concentrated heat causes the material to melt in a predictable manner in order to form a desired structure such as a mold preform. The energy of the laser and thus the heat applied to the material, is typically controlled by the use of a pulsed DC voltage or current control signal having a variable duty cycle. The duty cycle can be correlated to laser power using a graph plotting laser power versus duty cycle supplied by the laser manufacturer, or by a calibration process performed by the user. The greater the duty cycle, more energy is obtained from the laser and thus a higher localized temperature is achieved.

The exact duty cycle of a digital signal also is important in several other applications. For example, many single loop controllers utilize duty cycle information for controlling such things as a valve, heater, etc. In another example, circuits and systems employing pulse width modulation techniques may include a feedback loop based on the duty cycle of a signal. Therefore, it will be appreciated that the invention described herein has utility in any application where it is desirable to determine the duty cycle of a signal.

The duty cycle, of course, is commonly defined as the percentage of time over one cycle that a digital signal is in a positive or active state, usually expressed as a percent. For example, if a control signal has a total cycle duration of 20 milliseconds (corresponding to a frequency of 50 hertz), and during each cycle the control signal is logic high or active for 6 milliseconds, then the signal is said to have a duty cycle of 30 percent. Similarly, if such a 50 hertz control signal is active for 15 milliseconds, then the signal is said to have a duty cycle of 75 percent.

Although a variable duty cycle of a control signal is a convenient way to try to control the output power of a laser, known systems simply provide an adjustment knob that an operator manually turns in order to increase or to decrease the duty cycle of the control signal. This type of control is very imprecise because the knob rotary position is not calibrated with respect to the duty cycle or laser power. Furthermore, there is no feedback to the operator of the actual duty cycle setting of the signal. The operator, therefore, must rely on his or her own experience and dexterity to adjust the knob to the correct position in order to have the control signal duty cycle and hence the laser energy at the desired setting.

In such known systems, efforts to provide a visual feedback to the operator of the control signal duty cycle relied on the use of an oscilloscope. The control signal is parallel fed to a display input to the oscilloscope which displays and/or stores one or more cycles of the control signal. The operator can thus view the control signal logic state over one cycle and calculate the percent duty cycle. This technique, however, is inefficient due to the need for operator interpretation of the display signal, and also is subject to errors from miscalculation or misreading of the oscilloscope display. The need for oscilloscopes is also not cost effective for field use because such scopes are in themselves expensive, require careful handling and added space, and may require special power connections.

The need exists, therefore, for a convenient and cost-effective way for accurately determining the duty cycle of a control signal without the need for operator interpretation or calculation.

SUMMARY OF THE INVENTION

The present invention solves the problems and inconveniences of the prior art by providing a circuit and method for determining the duty cycle of a control signal that are inexpensive to implement and simple to utilize. The invention contemplates a circuit and method of using the same that monitors the control signal and generates an output signal that corresponds to the duty cycle of the control signal. According to this aspect of the invention, the circuit automatically determines the duty cycle of the control signal without the need for operator interface. Preferably, the circuit also includes a display that provides an operator with visually perceptible feedback of the control signal duty cycle.

The present invention further contemplates an electronic circuit for determining the duty cycle of a control signal that can be inexpensively realized using commercially available low-cost components. According to this aspect of the invention, such a circuit can be realized using a simple counter device that preferably includes a visual display means. The counter device is enabled by the control signal and related timing circuits so as to provide a count output that is directly related to the duty cycle of the control signal. The use of an electronic counter device results in a very high precision in determining the percent duty cycle of a control signal. Alternatively, the advantages of the present invention can be also realized by integrating the circuit components into a single integrated circuit or combining the circuit into a larger control system according to the particular application of the invention.

Simplicity of the invention and the ability to use commercially available components enhances reliability.

The low cost, small size, high accuracy and simple operation of a circuit according to the present invention makes the invention particularly convenient to use in field applications where cost, time and space are often important considerations for test and measurement equipment. These and other advantages of the present invention will be apparent to those having ordinary skill in the art from reading the following detailed description of the preferred embodiment in view of the accompanying drawings.

DESCRIPTION OF THE PREFERRED EMBODIMENTS

Figure 1:
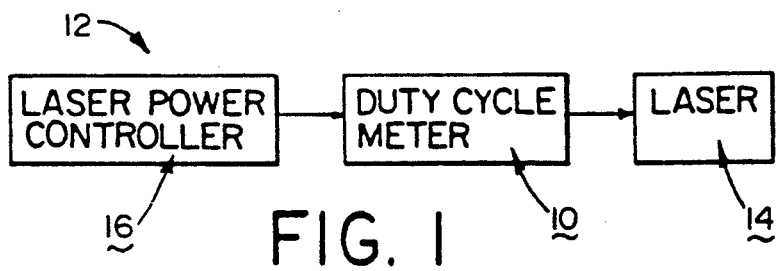
FIG. 1 is a simplified functional block diagram for a laser control apparatus that uses a duty cycle circuit according to the present invention.

The present invention provides a circuit, and method for using the same, which provides an output signal that corresponds to the duty cycle of a control signal. In the drawings like referenced numerals designate like parts in the several figures, and usually a suffix "a" following a reference numeral designates a signal on a line, terminal, conductor, etc. of the same reference numeral.

With reference to FIG. 1, for example, the invention has been successfully realized in the form of a duty cycle meter or circuit 10 as part of a laser beam control device 12 in a selective laser sintering machine. In such a system, a laser beam heat source 14 has a power or energy characteristic that can be precisely controlled by the use of a variable duty cycle control signal. The laser beam control device 12 includes a controller 16 that produces among other things a control signal that is input to the duty cycle device 10. The duty cycle device 10 detects the duty cycle of the control signal on a real time basis, and displays the reading so that the operator can make appropriate adjustments to achieve the desired laser power. The duty cycle device 10 passes the control signal through to the laser 14. While the invention is described herein with respect to being part of a laser beam controller, those skilled in the art will readily appreciate that the invention can be used in any application or in connection with any electronic circuit wherein determination of the duty cycle of an electrical signal is useful information.

Figure 2:
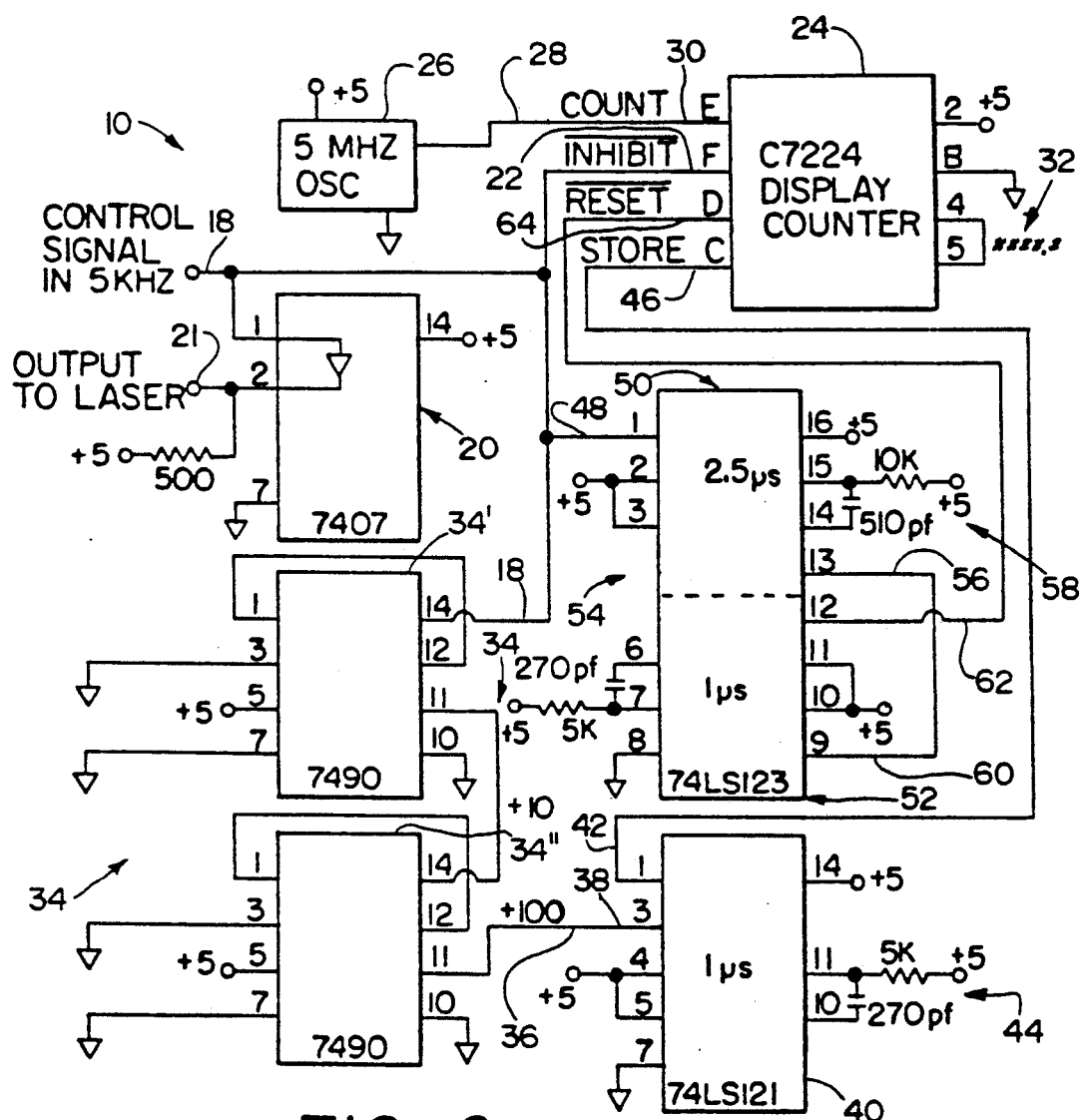
FIG. 2 is an electrical schematic diagram of a circuit for determining the duty cycle of a control signal according to the present invention.

With reference now to FIG. 2, a circuit for determining the duty cycle of an electrical control signal is generally indicated by the numeral 10. The circuit 10 includes an input line 18 that receives an input control signal 18a (shown in FIG. 4, for example) that may be, for example, a DC alternating voltage (or corresponding current) having a predetermined frequency. For example, the control signal can be a laser control signa; that has a variable or adjustable duty cycle. The duty cycle of the control signal may vary or may be adjusted in any convenient manner well known to those having ordinary skill in the art. The particular manner in which the duty cycle of the control signal may vary or the particular means employed to adjust the duty cycle of the control signal forms no part of the present invention. In the case of a laser control signal, the circuit 10 may be connected in parallel to a signal conditioner 20 that provides a voltage or current boost to the control signal as required by the laser device connected at terminal 21, for example.

The control signal on line 18 is connected to a count inhibit input 22 of a digital counter 24. A suitable device for the counter 24 is a C7224 counter manufactured by LASCAR Electronics Limited of England. In the example being described, the control signal on line 18 has a frequency of 5 kilohertz, but any stable frequency may be used that does not exceed the response time of the counter 24.

The circuit 10 further includes an oscillator 26 that produces an oscillator output signal on line 28. The term "oscillator" is used herein in its broadest sense to refer to any device that produces a predetermined output of periodic pulses or cycles. The oscillator output signal on line 28 is preferably an AC signal at a frequency of 5 megahertz, or 1000 times the frequency of the control signal 18a. As will be explained herein, the oscillator frequency is selected to be a power of ten multiple of the control signal frequency to provide a simple technique for converting the counter 24 output to a percent duty cycle reading. The oscillator output signal on line 28 is connected to a count input 30 of the counter 24. The counter 24 detects each cycle or pulse produced by the oscillator 26 and accumulates the total counts as a memory-type device until the counter 24 is reset or initialized. The counter 24 is enabled to count the oscillator output signal pulses, however, only during time periods when the count inhibit input 22 is deactivated. Because the count inhibit input 22 is activated by the control signal 18a, the counter is enabled to count the oscillator 26 output signal pulses only when the control signal 18a on line 18 is logic high or in the active state. Thus, the counter 24 only counts during the active interval of each cycle of the control signal 18.

The counter 24 preferably includes a built-in visual display 32, such as a liquid crystal display (LCD), for visually displaying the number of oscillator pulses counted during each of the control signal active intervals. Alternatively, of course, the display 32 could be a separate display device connected to the count output of the counter 24.

The control signal 18a on line 18 is also input to a divider circuit 34 that includes two serially connected divide-by-ten counters 34' and 34". The divider circuit 34 counts the number of control signal 18a cycles and produces a divider output signal 36a on line 36 at the end of every one-hundred control signal cycles. That is, after the dividers 34' and 34" have counted one-hundred cycles of the control signal 18a, the divider circuit 34 produces an output pulse 36a.

The divider circuit output pulse signal 36a is connected to a trigger input 38 of a one-shot monostable multivibrator 40 such as a 74LS121 device manufactured by Texas Instruments, Incorporated. The one-shot device 40 produces an output trigger pulse 42a on line 42 of predetermined duration, such as 1.0 microsecond in response to being triggered by the output pulse 36a from the divider circuit 34. As is well known, the duration of the one-shot pulse can be predetermined by appropriate selection of the timing resistor and capacitor combination 44. The one-shot output line 42 is connected to a store input 46 of the counter 24 and hence the one-shot 40 will hereinafter be referred to as the store one-shot. The signal on the store input 46 is used to command the counter 24 to update and to store the most recent count total when the store trigger signal 42a is received. Because the store trigger signal 42a is produced only after one-hundred cycles of the control signal 18a, the counter output display 32 is updated every one-hundred cycles of the control signal. It will be apparent to those skilled in the art that the frequency at which the counter is updated is largely a matter of design choice. For example, if the control signal is operating at 5 kilohertz, the divider circuit 34 triggers the update and store function in the counter every 20 milliseconds. The frequency at which the counter 24 is updated can easily be controlled by selection of the total divide count of the divider circuit 34.

The control signal 18a is also input to a trigger input 48 of another one-shot monostable multivibrator 50.

Preferably, the one-shot 50 is one of two such devices (the other one-shot being designated 52) contained in a single integrated circuit package 54, such as a 74LS123 device manufactured by Texas Instruments, Incorporated. The one-shot device 50 produces an output trigger pulse 56a on line 56 of predetermined duration, such as 2.5 microseconds, in response to the appropriate control signal 18a at the trigger input 48. The one-shot trigger input 48 is selected to trigger off of the trailing edge at the end of the active portion of each cycle of the control signal 18a. Thus, the output trigger pulse on line 56 is generated at the end of each active interval of the control signal 18a. Again, the duration of the output pulse on line 56 can be predetermined by appropriate selection of the timing resistor and capacitor 58.

The one-shot output 56 is connected to a trigger input 60 of a third one-shot device 52 which preferably is the other one-shot of the dual device 54. The third one-shot produces an output trigger pulse 62a on line 62 of predetermined duration, such as 1.0 microsecond, in response to the appropriate signal received at the trigger input 60 from the second one-shot 50. The third one-shot output 62 is connected to a reset input 64 of the counter 24, and hence the one-shot 52 is hereinafter referred to as the reset one-shot 52. The reset input 64 to the counter 24 is used to command the counter to be reset or initialized to a predetermined count, preferably zero. The reset one-shot 52 triggers off of the trailing edge of the 2.5 microsecond pulse from the one-shot 50, hence the one-shot 50 is hereinafter referred to as the delay one-shot 50. Thus, as configured in FIG. 2, the counter 24 is preferably reset at the end of a 2.5 microsecond delay after the end of the active interval of each cycle of the control signal 18a.

It should be noted at this time that the counter 24 is preferably reset at the end of the active interval for each cycle of the control signal 18a, but the counter 24 only updates and displays on the display 32 the number of counts after every one-hundred cycles of the control signal 18a. The 2.5 microsecond delay from the delay one-shot 52 ensures that the counter is reset only after the store command is received from the store one-shot 40. Thus, the divider circuit 34, the delay one-shot 50, the reset one-shot 52, and the store one-shot 40 function as a timing circuit that synchronizes the operation of the counter 24 with the oscillator 26 and the control signal 18a. Those skilled in the art will readily appreciate that the rate at which the display 32 is updated or the counter reset is largely a matter of choice based on the requirements of the particular application.

Figure 4:
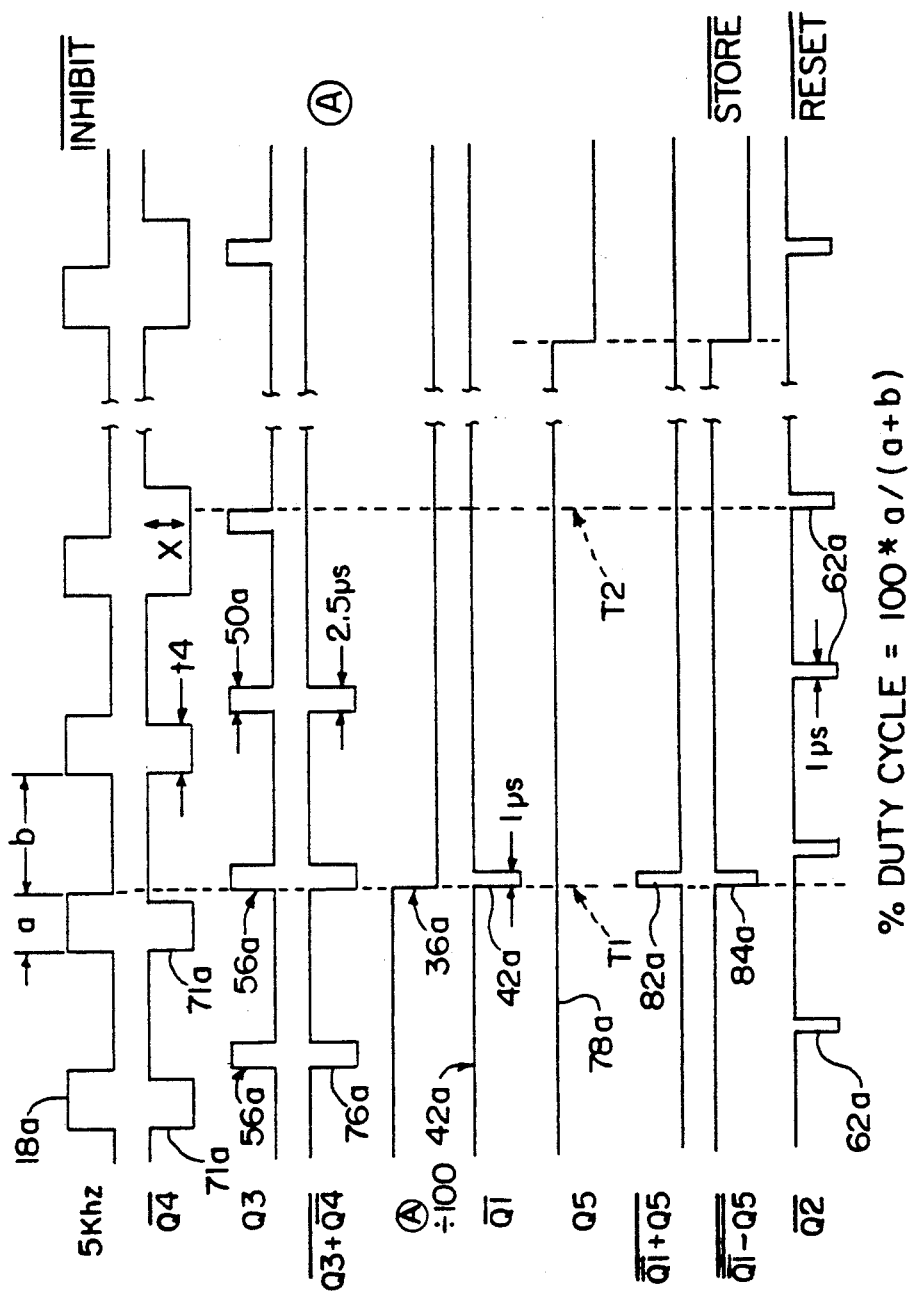
FIG. 4 is a timing diagram of various signals generated during operation of the circuits illustrated in FIGS. 2 and 3A and 3B.

Sequential operation of the circuit 10 can best be understood with reference to the timing diagram of FIG. 4. As illustrated, the control signal 18a is a periodic series of high and low DC logic states at a frequency of, for example, 5 kilohertz. There are two distinct time intervals for each cycle and those intervals are labeled "a" and "b" in the drawing. Interval "a" is the logic high or active time period, and interval "b" is the logic low or inactive time period. The percent duty cycle, therefore, is defined by the ratio $100*a/(a+b)$ with "a" and "b" being expressed in units of time.

The vertical dotted lines T1, T2, etc. in FIG. 4 are provided to emphasize the timing relationships that exist between the various signals. Thus, at the end of each active interval "a" of the control signal 18a, the trailing edge of the control signal triggers the delay one-shot 50 (as indicated at the dotted line T1), which produces an output pulse 56a on line 56. The trailing edge of the delay pulse 56a triggers the reset one-shot 52 (as indicated by the dotted line T2), which produces a reset trigger pulse 62a on line 62. The reset pulse 62a in turn initializes the counter 24, and this occurs after a predetermined delay 50a, which is determined by the duration of the delay pulse 56a from the end of each active interval of the control signal 18a.

The divider circuit 34 counts the number of control signal 18a cycles as described hereinabove, and at the end of each hundred cycles produces a trigger pulse 36a on line 36. The active edge of this pulse 36a coincides with the trailing edge of the one-hundredth control signal active interval, as illustrated by the line T1. The trigger pulse 36a causes the store one-shot 40 to produce a store output pulse 42a on line 42, which in turn causes the counter 24 to store the most recent count total and to display that total on the display 32. It will be noted that the store pulse 42a necessarily occurs before the next immediate reset pulse 62a so that the count can be saved for display before the counter is reset. This timing is, of course, provided by the delay pulse 56a.

As described herein, the counter 24 detects and counts each pulse from the oscillator 26 during each active interval of the control signal 18a. Because the oscillator frequency is a power of ten multiple of the control signal frequency, the count output of the counter 24 is a direct indication of the control signal duty cycle. In the example being described, the oscillator is operating at a frequency 1000 times faster than the control signal frequency. Therefore, if at the end of active interval "a" of the signal 18a the counter reading is 350, then the operator knows that the duty cycle is 35 percent. The location of the decimal point is, of course, simply a function of the frequency multiple. Thus, for example, when the oscillator is running at 1000 times the control signal frequency, the duty cycle output of the counter is accurate to within 0.1 percent. The circuit 10 therefore allows the designer to choose whatever level of accuracy is required for the particular application.

The counter 24 stores and displays the count total on the display 32, which thus serves as a means for the operator to determine the duty cycle of the control signal. However, those having ordinary skill in the art will immediately understand that the duty cycle information is inherent in the counter count total. Thus, in a particular application, the designer may prefer to use a digitized output from the counter in other logic circuits to calculate or to display the duty cycle in a different format, or to use the counter output for other purposes in different circuitry. Also, the circuit 10 could be used in a manner in which the oscillator 26 operates at some multiple other than a power of ten higher than the control signal frequency, with subsequent signal processing being used to determine the duty cycle. For example, if the oscillator were operating at 500 times the control signal frequency, then the counter 24 output would correspond to a reading of half of the duty cycle. A doubler could then be used to convert that output to a direct indication of the duty cycle. Thus, an important aspect of the invention is that the circuit 10 provides an output that corresponds in a predetermined way to the control signal duty cycle, but how a designer chooses to utilize or process that data is largely a matter of preference depending on the particular application for the invention.

Figure 3A:
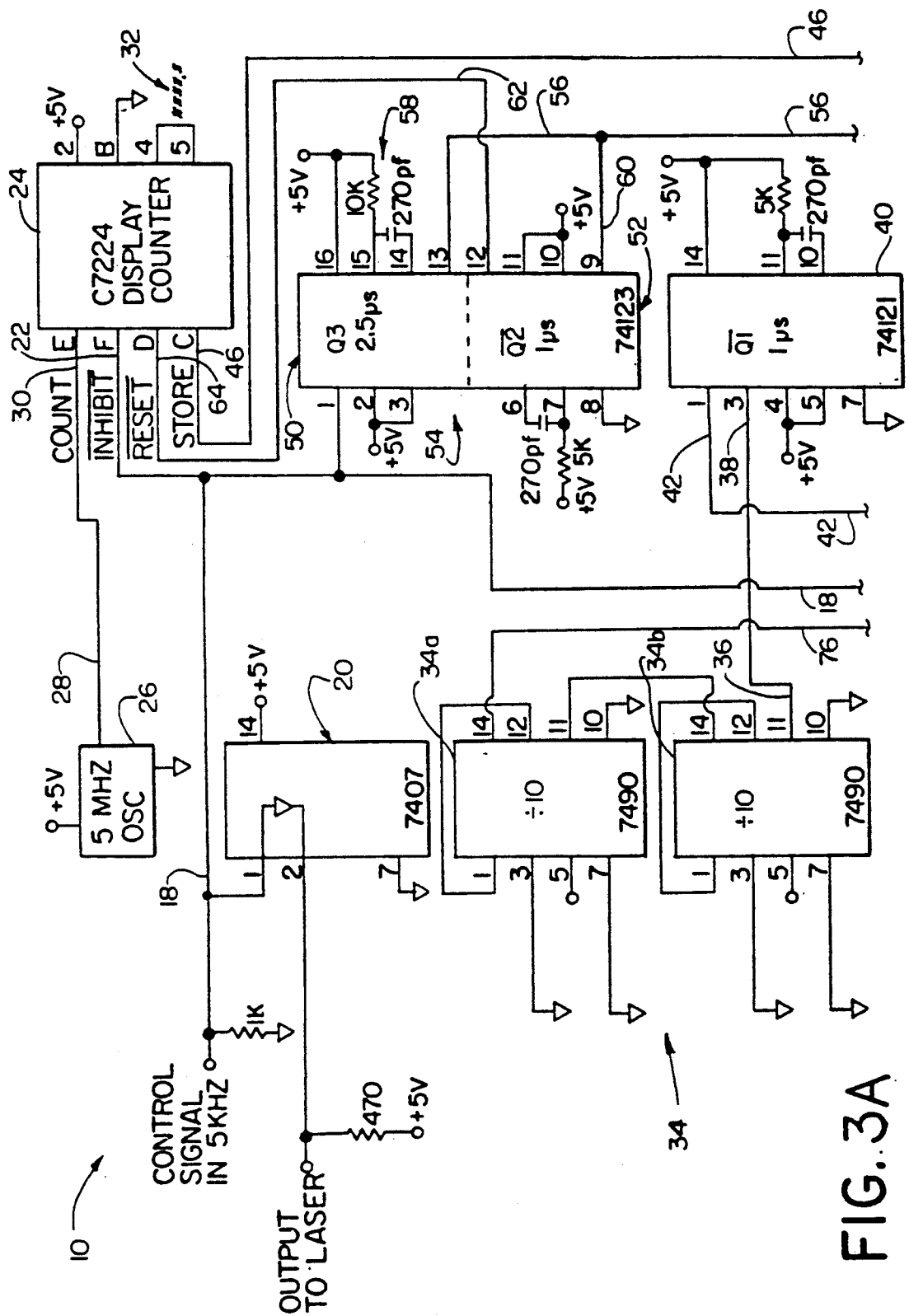
FIGS. 3A and 3B are an electrical schematic diagram of a circuit similar to the circuit of FIG. 2, but including additional control features.
Figure 3B:
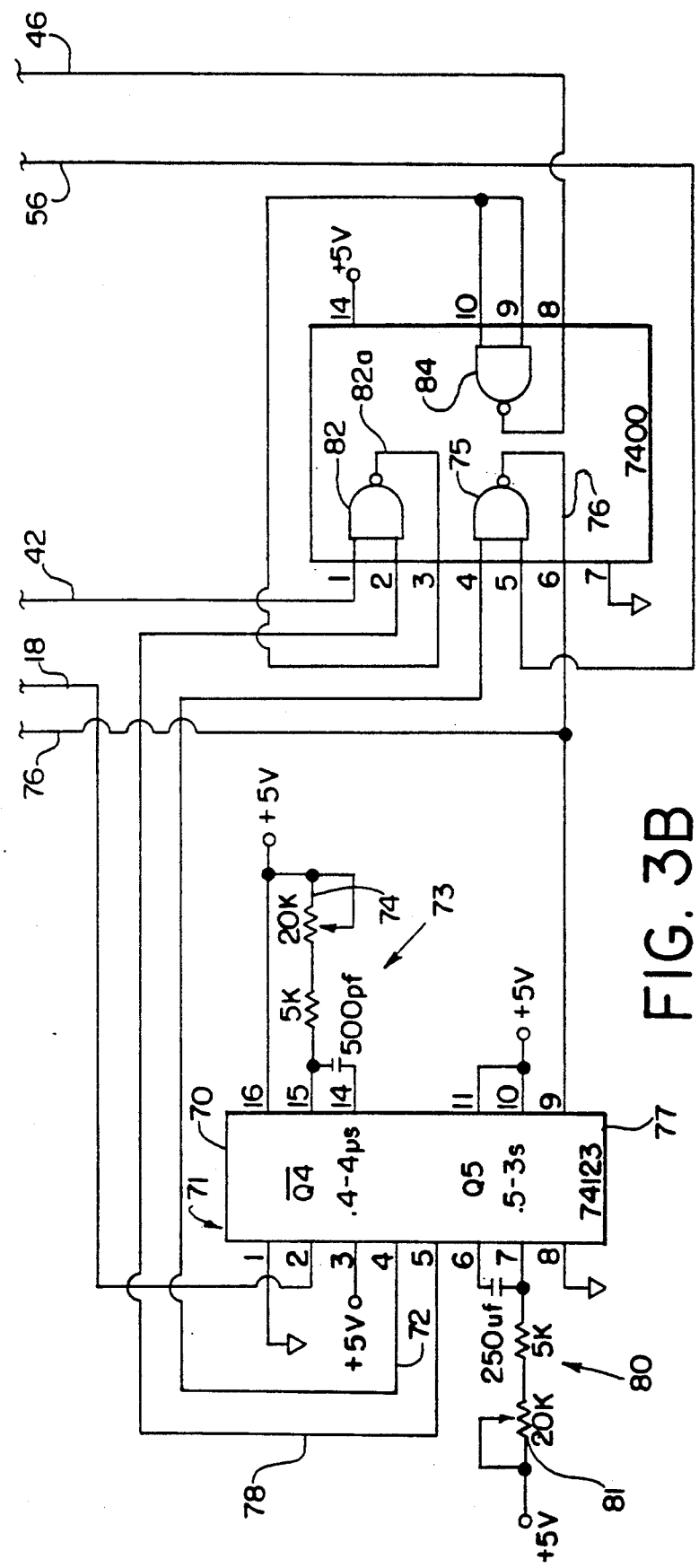

Referring now to FIGS. 3A and 3B, the preferred embodiment of the invention is shown with certain additional features that may be useful in some applications. In FIGS. 3A and 3B, many of the components are the same as those in FIG. 2 and are given the same reference numerals. Thus, the circuit 10' of FIG. 3 includes the oscillator 26 that is connected to the count input 30 of the counter 24. The control signal 18a on line 18 is input to the count inhibit input 22 of the counter 24, is further input to the divider circuit 34, and also is input as a trigger signal to the delay one-shot 50. The delay one-shot 50 triggers the reset one-shot 52 which in turn causes the counter to be initialized. The divider circuit 34 triggers the store one-shot 40 which in turn causes the counter to store and to display the most recent count total from an active interval of the control signal. Operating frequencies of the oscillator and control signal may be the same as the example described with respect to FIG. 2.

Certain additional components, however have been added in the circuit 10' of FIGS. 3A and 3B. Although the control signal 18a is still used as the input to the divider circuit 34, the input function is not direct. Rather, the control signal 18a serves as a trigger signal for a threshold one-shot 70. The threshold one-shot may conveniently be one of two dual one-shot devices provided in a single package 71 like the dual device 54. As shown in FIG. 4, the threshold one-shot triggers off of the leading edge of each control signal 18a active interval "a" and generates a threshold pulse 71a on line 72. The pulse 71a has a predetermined duration that is set by a timing resistor and capacitor circuit 73. It will be noted that the timing resistor 74 is an adjustable potentiometer so that the operator can selectively adjust the duration of the threshold pulse 71a.

The timed output pulse 71a on line 72 of the threshold one-shot 70 is connected to an input of a threshold NAND logic gate 75. Another input to the threshold NAND gate 75 is connected to the output line 56 from the delay one-shot 50. Thus, the threshold NAND gate 75 output signal 76a on line 76 is a function of the duration of the threshold pulse 72a and the delay pulse 56a. As shown in FIG. 4, if the time duration of the threshold pulse 71a is shorter than the duration of the active interval "a" for each control signal 18a cycle, then the threshold NAND gate 75 produces an output pulse 76a that is connected to the input to the divider circuit 34, so that the divider circuit counts that respective control signal cycle. However, if the duration of the threshold pulse 71a is longer than the duration of the active interval of a control signal cycle, then there is no output pulse from the NAND gate 75 and the divider circuit 34 does not count that respective control signal cycle. Such an example is shown in FIG. 4 at time X. The threshold pulse 71a timing can, therefore, be adjusted so that only control signal cycles having a predetermined duty cycle are counted, with the corresponding percent duty cycle being displayed on the display 32.

The output signal 76a on hold store line 76 of the threshold NAND gate 75 is also input as a trigger signal to a hold store one-shot 77, which preferably is the other one-shot in the dual device 71. The hold store one-shot 77 produces on line 78 an output pulse 78a of predetermined duration. The duration of the override pulse 78a can be set by the timing resistor and capacitor circuit 80. In a manner similar to the threshold one-shot 70, the duration of the override pulse 78a can be adjusted by the potentiometer 81a.

The output at line 78 of the hold store one-shot 77 is connected to one input of a NAND logic gate 82. The other input to the NAND gate 82 is connected to the output 42 from the store one-shot 40. Thus, the NAND gate output signal 82a on line 82 is a function of the duration of the pulse 78a and the store trigger signal 42a. As shown in FIG. 4, so long as the one-shot output 78a is logic high, the NAND gate 82 feeds through the store pulse 42a to the counter 24 in the form of a NAND gate output pulse 82a through an inverter-type NAND gate 84. However, when the output state of the hold store one-shot 77 is inactive, the store pulse 42a is not passed through to the counter 24 and thus the counter display 32 is not updated for that control signal 18a cycle. There can be situations where the control signal 18a on line 18 will consist of only a limited number of cycles or pulses, i.e., less than one-hundred cycles, and then the signal 18a will remain in a low logic state for some period of time. In such case, the duration of the pulse 78a from the hold store one-shot determines how long the output signal 82a of gate 82 will remain high in the absence of a succeeding store pulse 42a. As a result, the output signal 82a, as it is coupled through the inverter 84, will cause the value of the last measured duty cycle in the "burst" to be stored and displayed by the counter display 32 for a predetermined amount of time. Thereafter, the counter display 32 is reset to zero until the cycle on the control line 18 is received.

In a general sense, of course, the threshold one-shot 70, the hold store one-shot 77 and the NAND logic gates 75, 82 and 84 are additional optional features of the timing logic which can enhance the performance of the circuit 10 in many applications.

While the invention has been shown and described with respect to specific embodiments thereof, this is for the purpose of illustration rather than limitation, and other variations and modifications of the specific embodiments herein shown and described will be apparent to those having ordinary skill in the art within the intended spirit and scope of the invention as set forth in the appended claims.

We claim:

1. A circuit for determining duty cycle of a control signal having a frequency, said circuit comprising an oscillator, counter means for counting cycles produced by said oscillator and for producing a counter means output that corresponds to said counted cycles, said counter means having a count inhibit input with the control signal being connected to said count inhibit input so that said counter means counts said oscillator cycles during predetermined intervals of the control signal, and delay means for resetting said counter means after the control signal intervals, said oscillator frequency being a predetermined multiple higher than the control signal frequency so that the duty cycle is a function of said counter means output.

2. The circuit according to claim 1 wherein said counter means output is connected to a display means for providing a visually perceptible output of the control signal duty cycle.

3. The circuit according to claim 1 wherein said counter means is enabled to count said oscillator cycles during each positive or active interval of the control signal.

4. The circuit according to claim 3 wherein said counter means further includes a store input which when activated causes said counter means to store and display the control signal duty cycle, and wherein the circuit further includes update means to activate said counter means store input after one or more of said control signal intervals.

5. The circuit according to claim 4 wherein said update means activates said counter means store input before said delay means resets said counter means.

6. The circuit according to claim 5 further comprising threshold means that causes said update means to ignore a control signal interval that has a duty cycle less than a selectable minimum.

7. The circuit according to claim 6 wherein said threshold means includes a timer that starts at the beginning of each of said control signal intervals and ends after a selectable delay, said timer producing an output signal that inhibits said update means during said selectable delay.

8. The circuit according to claim 7 further comprising divider means that causes said update means to activate said counter means store input after a predetermined number of said control signal intervals have been detected by said divider means.

9. The circuit according to claim 8 wherein said timer output signal inhibits said update means by causing said divider means to detect control signal intervals that are longer than said selectable minimum.

10. The circuit according to claim 9 further comprising override means for activating said counter means store input for a selectable time interval independent of said update means control.

11. The circuit according to claim 2 wherein said display means provides a decimal display of said counter means output.

12. The circuit according to claim 11 wherein said oscillator frequency is a multiple of the control signal frequency by a predetermined power of ten so that the number of oscillator cycles counted during each of said control signal intervals is the duty cycle.

13. The circuit according to claim 10 wherein said counter means includes a display means that provides a visually perceptible output of said counter means output.

14. The circuit according to claim 12 wherein the control signal is a digital wave having a variable duty cycle.

15. A laser drive control circuit for detecting laser power as a function of a control signal having variable duty cycle, said circuit comprising a counter, an oscillator and a timing circuit, said oscillator producing at an output periodic pulses at a frequency that is a predetermined multiple of the control signal frequency, said counter having a count input connected to said oscillator output to count the number of said oscillator pulses, said counter also having an inhibit input activated by the control signal, said counter being in a count mode during one portion of the control signal and being in a no-count mode during another portion of the control signal; said timing circuit producing a first trigger signal in response to the end of said one portion of the control signal, said timing circuit producing a second trigger signal after a predetermined delay from said first trigger signal, said first trigger signal causing said counter to store the number of oscillator pulses counted during said one portion of the control signal; and said second trigger signal initializing said counter; said number of counted oscillator pulses corresponding to duty cycle of the control signal.

16. A control circuit according to claim 15 further comprising a display means for providing a visually perceptible output of the control signal duty cycle.

17. A control circuit according to claim 16 wherein said oscillator frequency is a decimal multiple of the control signal frequency so that the number of oscillator pulses counted during an active interval of a control signal cycle is the duty cycle of the control signal.

18. A control circuit according to claim 16 wherein said display means displays the number of oscillator pulses counted during an active interval of the control signal.

19. A method for determining the duty cycle of a control signal comprising the steps of:
   a. providing an oscillator that produces output cycles at a frequency that is a predetermined multiple of the control signal frequency;
   b. providing a counter that counts the number of cycles from the oscillator when the counter is enabled;
   c. using the control signal to enable the counter during a portion of each of the control signal cycles so that the number of oscillator cycles counted corresponds to the duty cycle of the control signal; and
   d. resetting the counter after a predetermined delay from the end of said portion of the control signal.

20. The method according to claim 19 wherein the step of providing an oscillator includes the step of selecting the oscillator frequency to be a power of ten multiple higher than the control signal frequency, and further comprising the step of displaying the total number of oscillator cycles counted during an active interval of the control signal wherein said active interval is said portion of the control signal.

* * * * *